(12) United States Patent
Briggs et al.

(10) Patent No.: US 10,679,934 B2
(45) Date of Patent: Jun. 9, 2020

(54) CAPACITANCE REDUCTION IN SEA OF LINES BEOL METALLIZATION

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, Rhinebeck, NY (US); Huai Huang, Saratoga, NY (US); Christopher J. Penny, Saratoga Springs, NY (US); Michael Rizzolo, Albany, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/829,435

(22) Filed: Dec. 1, 2017

(65) Prior Publication Data
US 2019/0172783 A1  Jun. 6, 2019

(51) Int. Cl.
| H01L 23/522 | (2006.01) |
| H01L 23/532 | (2006.01) |
| H01L 21/768 | (2006.01) |

(52) U.S. Cl.
CPC .... *H01L 23/5222* (2013.01); *H01L 21/76819* (2013.01); *H01L 21/76837* (2013.01); *H01L 21/76843* (2013.01); *H01L 23/53238* (2013.01)

(58) Field of Classification Search
CPC .......... H01L 23/5222; H01L 21/76843; H01L 21/76837; H01L 23/53238; H01L 21/76819
See application file for complete search history.

(56) References Cited

U.S. PATENT DOCUMENTS

| 5,963,814 | A | 10/1999 | Walker et al. |
| 6,436,723 | B1 | 8/2002 | Tomita et al. |
| 6,717,267 | B1 * | 4/2004 | Kunikiyo ............ H01L 23/5283 |
| | | | 257/758 |
| 6,917,109 | B2 | 7/2005 | Lur et al. |
| 6,961,915 | B2 | 11/2005 | Loh et al. |
| 7,023,093 | B2 | 4/2006 | Canaperi et al. |
| 7,049,701 | B2 * | 5/2006 | Usui ...................... H01L 24/05 |
| | | | 257/773 |
| 7,084,479 | B2 | 8/2006 | Chen et al. |
| 7,470,630 | B1 | 12/2008 | Chen et al. |
| 7,825,019 | B2 | 11/2010 | Clevenger et al. |
| 9,111,763 | B2 * | 8/2015 | Kagawa ............ H01L 21/76807 |

(Continued)

OTHER PUBLICATIONS

Han et al., "ILP-Based Co-Optimization of Cut Mask Layout, Dummy Fill and Timing for Sub-14nm BEOL Technology", ITRS Report, Oct. 2015, 14 pages.

(Continued)

*Primary Examiner* — David Vu
(74) *Attorney, Agent, or Firm* — Tutunjian & Bitetto, P.C.; Vazken Alexanian (57) ABSTRACT

A semiconductor interconnect structure and a method of fabricating the same are provided. The semiconductor interconnect structure includes a sea of interconnect lines including metal lines and neighboring dummy lines. The semiconductor interconnect structure further includes a dielectric layer arranged between the sea of lines.

10 Claims, 14 Drawing Sheets

(56) References Cited

U.S. PATENT DOCUMENTS

| | | |
|---|---|---|
| 9,324,650 B2 | 4/2016 | Edelstein et al. |
| 9,343,294 B2 | 5/2016 | Chi et al. |
| 9,536,822 B2 * | 1/2017 | Summerfelt .......... H01L 23/522 |
| 2005/0101134 A1 | 5/2005 | Brask et al. |
| 2005/0186793 A1 * | 8/2005 | Omoto .............. H01L 21/76846 |
| | | 438/687 |
| 2007/0178713 A1 * | 8/2007 | Jeng ................ H01L 21/76814 |
| | | 438/787 |
| 2009/0302475 A1 * | 12/2009 | Korogi ................ H01L 21/7682 |
| | | 257/761 |
| 2010/0133648 A1 * | 6/2010 | Seidel ................ H01L 21/7682 |
| | | 257/522 |
| 2013/0323930 A1 * | 12/2013 | Chattopadhyay .......................... |
| | | H01L 21/02107 |
| | | 438/703 |
| 2014/0008804 A1 | 1/2014 | Purayath et al. |
| 2015/0339428 A1 | 11/2015 | Yuan et al. |
| 2016/0111326 A1 | 4/2016 | Ohori et al. |

OTHER PUBLICATIONS

Kurokawa, et al., "Dummy Filling Methods for Reducing Interconnect Capacitance and Number of Fills", Proceedings of the Sixth International Symposium on Quality Electronic Design (ISQED'05), Mar. 2005, 6 pages.

\* cited by examiner

CAPACITANCE REDUCTION IN SEA OF LINES BEOL METALLIZATION

BACKGROUND

Technical Field

The present invention relates generally to semiconductors and, in particular, to capacitance reduction in sea of lines BEOL metallization.

Description of the Related Art

The reduction of unwanted capacitance in the Back End Of Line (BEOL) portion of a semiconductor device can be needed in certain circumstances. For example, dummy line parasitic capacitance contributes ~35% to the total line capacitance.

A sea of lines approach dictates a higher percentage of dummy lines than previous patterning schemes to facilitate uniformity in numerous downstream processes. Such an approach can prevent deleting lines from original masks (e.g., in the cases of Lithography-Etch (LE) and Self-Aligned Double Patterning (SADP)) and create integration and pattern challenges in the case of irregular cut shapes (e.g., in the case of 7 nanometer Lithography Process (7LPe)).

Hence, there is a need for an approach to reduce capacitance in a sea of lines BEOL metallization.

SUMMARY

According to an aspect of the present invention, a semiconductor interconnect structure is provided. The semiconductor interconnect structure includes a sea of interconnect lines including metal lines and neighboring dummy lines. The semiconductor interconnect structure further includes a dielectric layer arranged between the sea of lines.

According to another aspect of the present invention, a method of fabricating an interconnect structure is provided. The method includes forming a sea of lines pattern including metal lines and dummy lines embedded in and coplanar with a first dielectric.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to capacitance reduction in sea of lines BEOL metallization.

In an embodiment involving a sea of lines BEOL, dummy line metallization is removed after Chemical Mechanical Planarization (CMP) and replaced with an airgap to decrease capacitance.

In an embodiment, the present invention can utilize block lithography from an airgap scheme to define open areas above dummy lines.

In an embodiment, Cu (or other metal/compound/material), liner and barrier are removed from exposed dummy lines with a plurality of wet/ion beam/dry etches.

In an embodiment, the present invention involves depositing a non-conformal dielectric cap, and pinching off and air gaping the dummy lines, thereby significantly reducing parasitic capacitance.

The sea of lines structure formed by the present invention can be used in a myriad of semiconductor devices, as readily appreciated by one of ordinary skill in the art. For example, the sea of lines structure can be used in memory devices, communication (receivers, transmitters, transceivers, etc.), and so forth.

Figure 1:
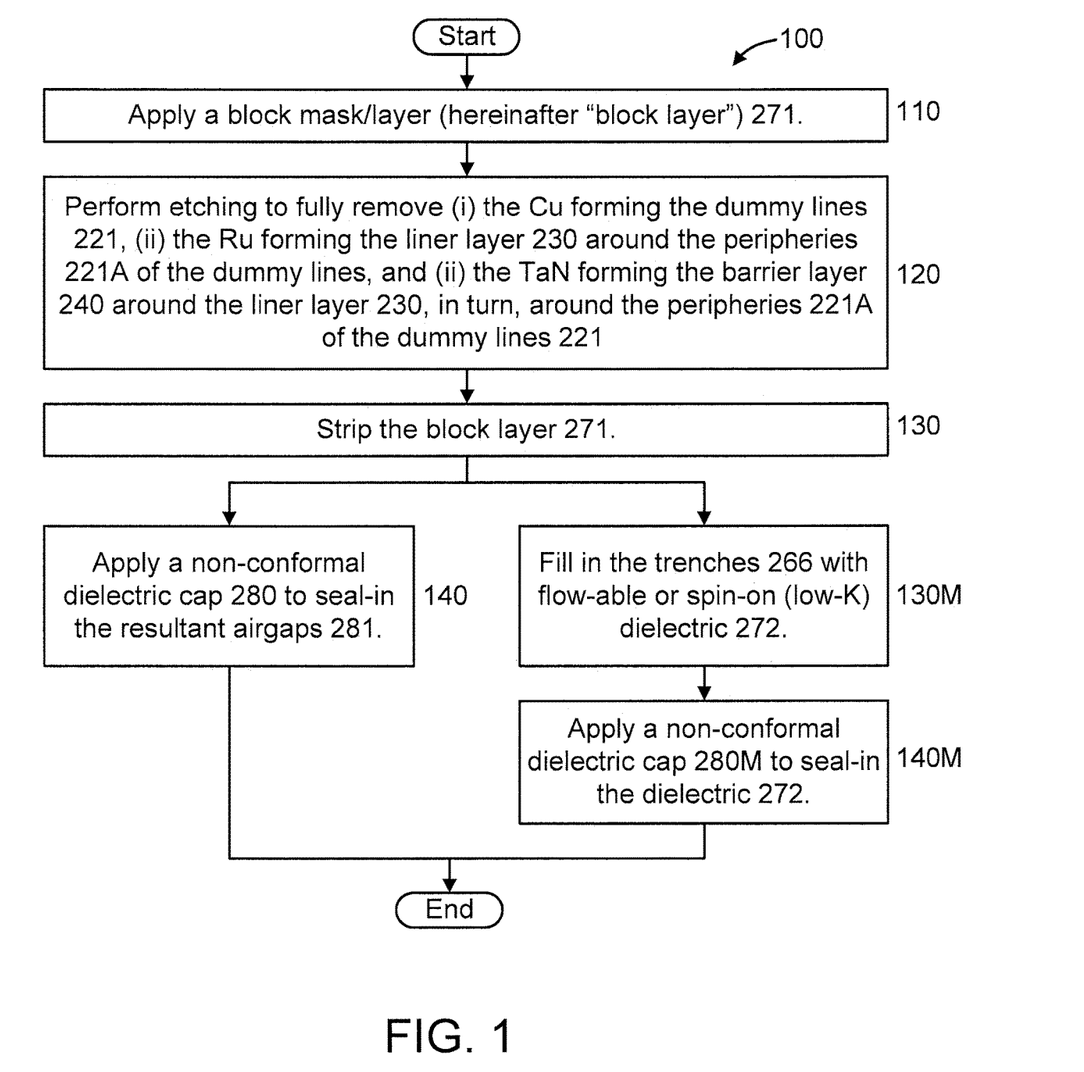
FIG. 1 shows an exemplary method for forming a sea of lines BEOL structure that employs capacitance reduction, in accordance with an embodiment of the present invention.

FIG. 1 shows an exemplary method 100 for forming a sea of lines BEOL structure (hereinafter interchangeably referred to as the "structure" in short 210) that employs capacitance reduction, in accordance with an embodiment of the present invention.

FIGS. 2-13 show an exemplary process flow 200 for the method 100 of FIG. 1, in accordance with an embodiment of the present invention. In an embodiment, the structure 210 processed by process flow 200 has already been subjected to Chemical Mechanical Planarization (CMP).

It is to be appreciated that certain semiconductor manufacturing processes are described herein with respect to FIGS. 1-13 such as, for example, etches. In an embodiment, such etching can involve one or more of wet etching, dry etching, and ion beam etching, as readily appreciated by one of ordinary skill in the art, given the teachings of the present invention provided herein. Hence, it is to be appreciated that the present invention is not limited to any particular type of process and thus, other processes can also be used, as readily appreciated by one of ordinary skill in the art given the teachings of the present invention provided herein, while maintaining the spirit of the present invention. That is, the present invention is not limited to any particular semiconductor manufacturing process and, thus, substitutions can be made for the processes described herein, while maintaining the spirit of the present invention.

Figure 2:
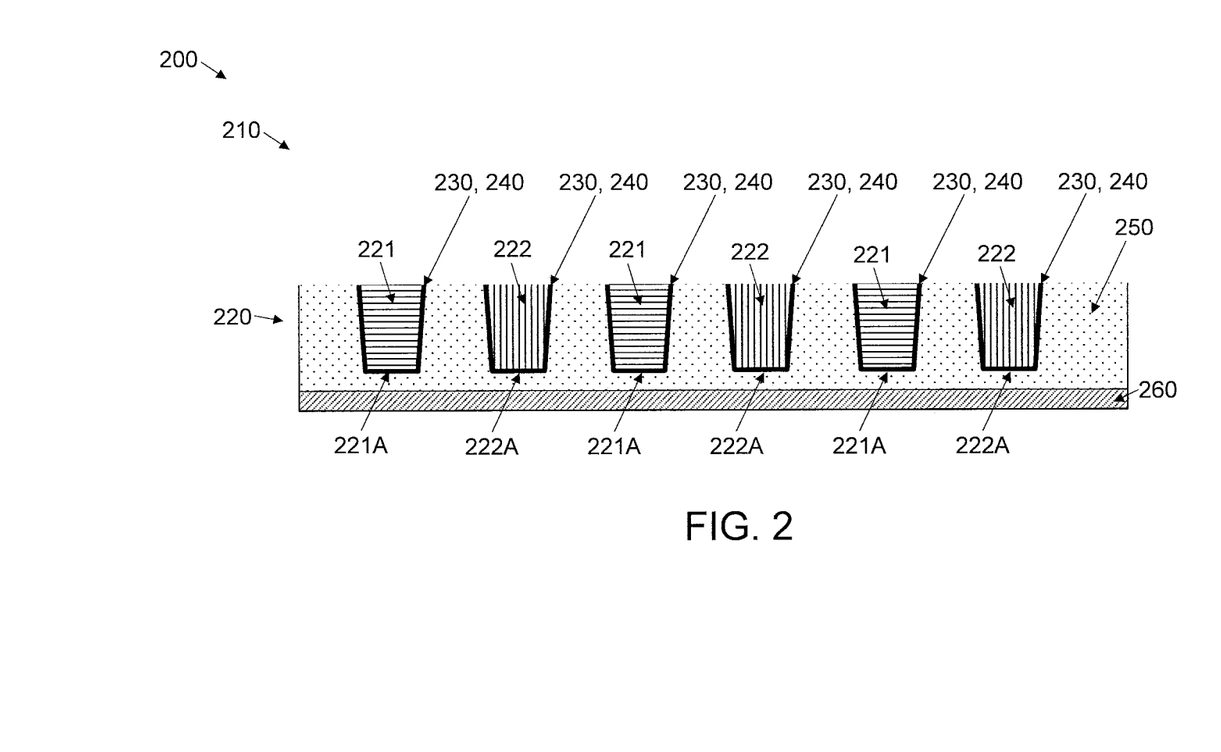
FIGS. 2 and 3 show side and top-down views, respectively, of the sea of lines BEOL structure at a point prior to commencement of a process flow, in accordance with an embodiment of the present invention.
Figure 3:
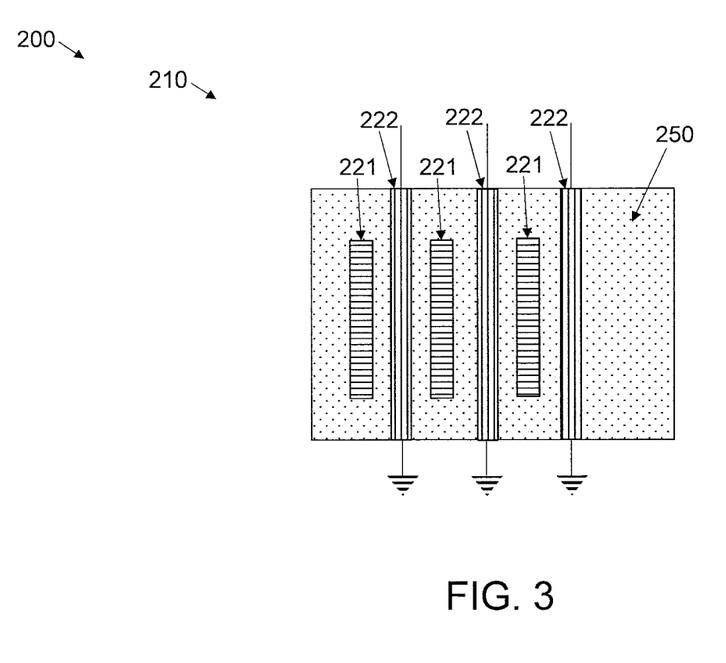

FIGS. 2 and 3 show side and top-down views, respectively, of the structure 210 at a point prior to commencement of the process flow 200, in accordance with an embodiment of the present invention. Basically, FIGS. 2 and 3 show the starting workpiece processed by method 100 of FIG. 1 and as shown in first through fourth stages depicted in FIGS. 4-14.

Referring to FIGS. 2 and 3, the structure 210 has a sea of lines 220 that include dummy lines 221 and neighboring non-dummy lines 222. In an embodiment, the dummy lines 221 and the non-dummy lines 222 are formed of Copper (Cu). Of course, other metals/compounds/materials (e.g., Silver (Ag), Gold (Au), Aluminum (Al), and so forth) can be used, while maintaining the spirit of the present invention.

Moreover, the structure 210 includes a liner layer 230 formed around the peripheries 221A and 222A of the dummy lines 221 and non-dummy lines 222, respectively. In an embodiment, the liner layer 230 is formed from Ruthenium (Ru). Of course, other compounds/materials can be used for the liner layer 230, while maintaining the spirit of the present invention.

Further, the structure 210 includes a barrier layer 240 disposed over the liner layer 230. In an embodiment, the barrier layer 240 is formed from Tantalum Nitride (TaN). Of course, other metals/compounds/materials can be used for the barrier layer 240, while maintaining the spirit of the present invention.

Also, an insulating layer 250 is formed between the dummy lines 221 and the non-dummy-lines 222. In particular, the insulating layer 250 is formed between the barrier layer 240 of the dummy lines 221 and the non-dummy lines 222. The insulating layer 250 can be formed from, e.g., a dielectric. Additionally, the structure 210 is formed on a layer 260. In an embodiment, layer 260 is a seal layer between the BEOL and the Front End Of Line (FEOL). In an embodiment, layer 260 is formed from Silicon Carbide (SiC). Of course, other compounds/materials can be used, while maintaining the spirit of the present invention.

As seen in FIG. 2, the non-dummy lines 222 are active lines connected at one end to ground (with the other end connections not shown).

Figure 4:
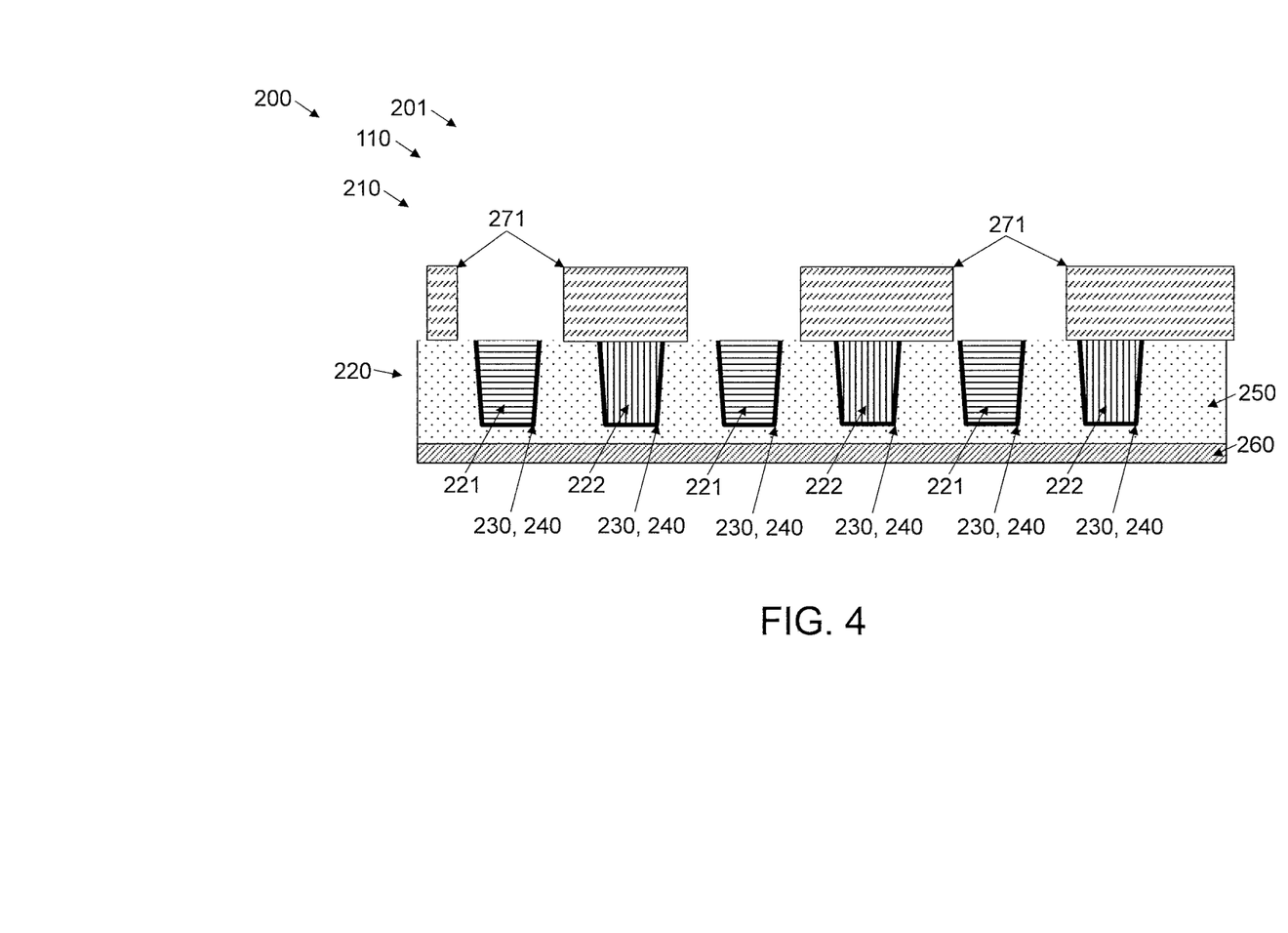
FIGS. 4 and 5 show side and top-down views, respectively, of the sea of lines BEOL structure at a first stage of the process flow, in accordance with an embodiment of the present invention.
Figure 5:
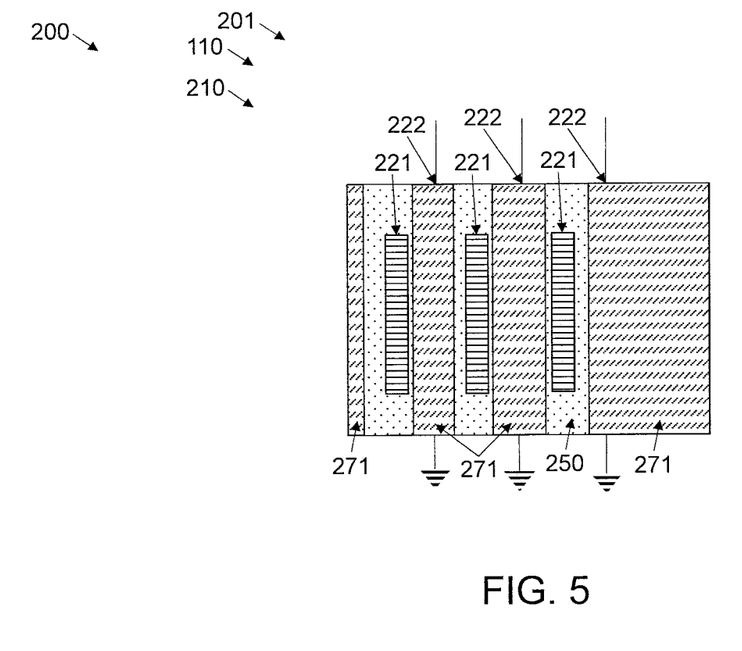

FIGS. 4 and 5 show side and top-down views, respectively, of the structure 210 at a first stage 201 of the process flow 200, in accordance with an embodiment of the present invention.

Referring to FIGS. 1, 4, and 5, at the first stage 201, at step 110, apply a block mask/layer (hereinafter "block layer") 271. The block layer 271 can be applied using any material deposition technique, as readily appreciated by one of ordinary skill in the art. The overlay of the block layer 271 is not major concern as long as the active lines (non-dummy lines 222) are fully protected (relative to the subsequent processes (e.g., etching) to follow). The dummy lines 221 are allowed to have overhang with the block layer 271 as long as liquid (e.g., from a wet etch process) can access the dummy lines 221. The block layer 271 can be applied, for example, using one or more of the following: a self-aligned double patterning (SADP); Litho-Etch-Litho-Etch (LELE); and so forth.

Figure 6:
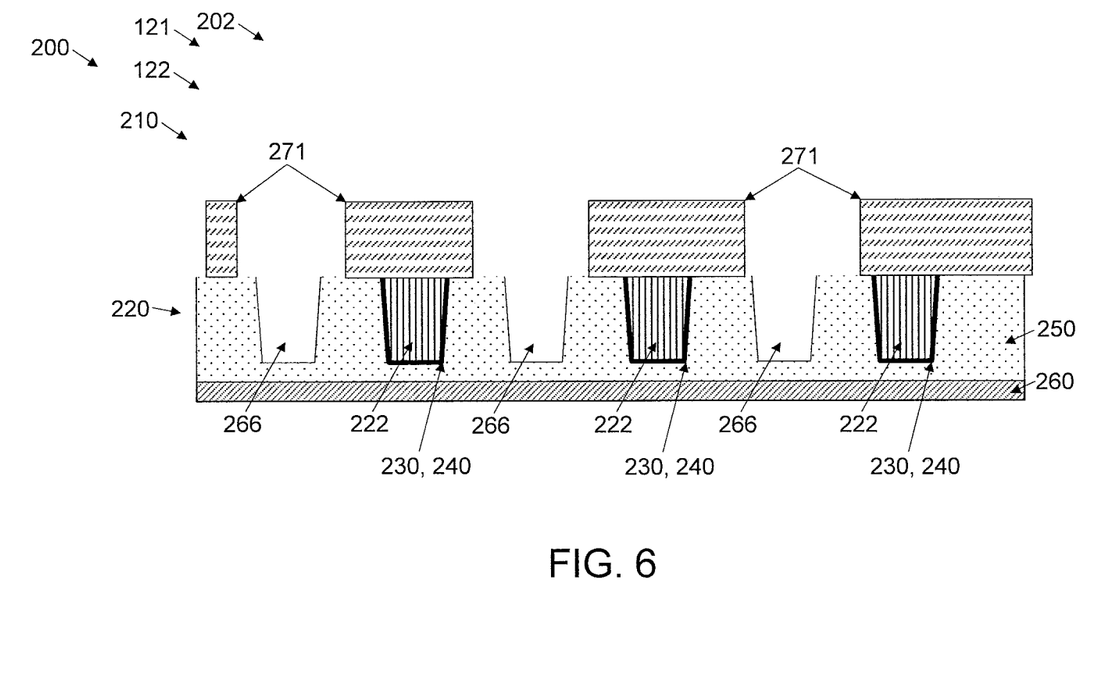
FIGS. 6 and 7 show side and top-down views, respectively, of the sea of lines BEOL structure at a second stage of the process flow, in accordance with an embodiment of the present invention.
Figure 7:
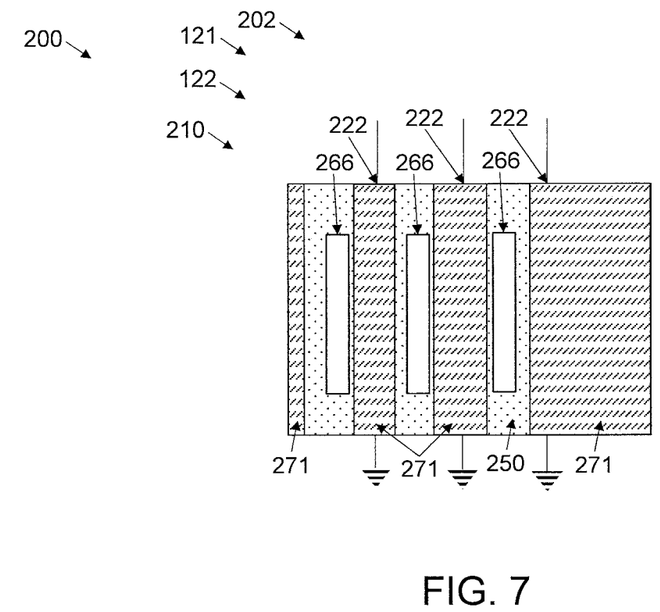

FIGS. 6 and 7 show side and top-down views, respectively, of the structure 210 at a second stage 202 of the process flow 200, in accordance with an embodiment of the present invention.

Referring to FIGS. 1, 6, and 7, at the second stage 202, at step 120, perform etching to fully remove (i) the Cu forming the dummy lines 221, (ii) the Ru forming the liner layer 230 around the peripheries 221A of the dummy lines, and (ii) the TaN forming the barrier layer 240 around the liner layer 230, in turn, around the peripheries 221A of the dummy lines 221. That is, remove the Cu (221), the Ru (230), and the TaN (240) associated with the dummy lines 221. The etching can involve, for example, but is not limited to, wet etching, dry etching, ion beam etching, and so forth. In this way, trenches 266 are formed in the insulating layer 250. The etching can involve specific chemicals for specific ones of the materials/layers, such that different materials/layers are subjected to different chemicals or different amounts of the same chemicals. Hence, in an embodiment, step 120 can involve sub-steps, each involving selectively etching a different material or group of materials.

Figure 8:
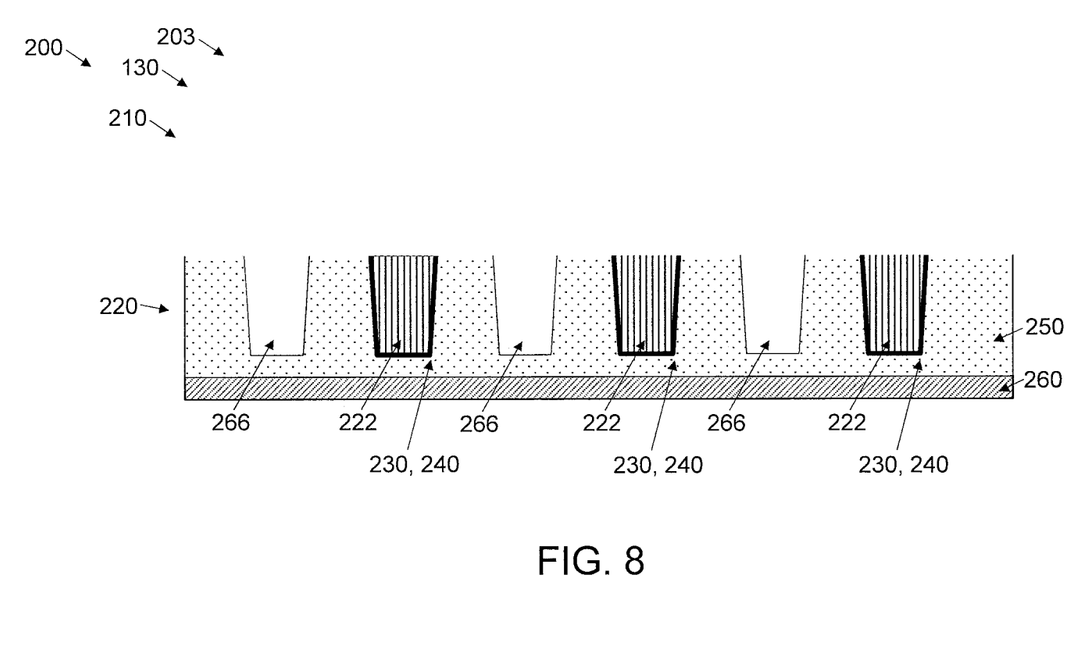
FIGS. 8 and 9 show side and top-down views, respectively, of the sea of lines BEOL structure at a third stage of the process flow, in accordance with an embodiment of the present invention.
Figure 9:
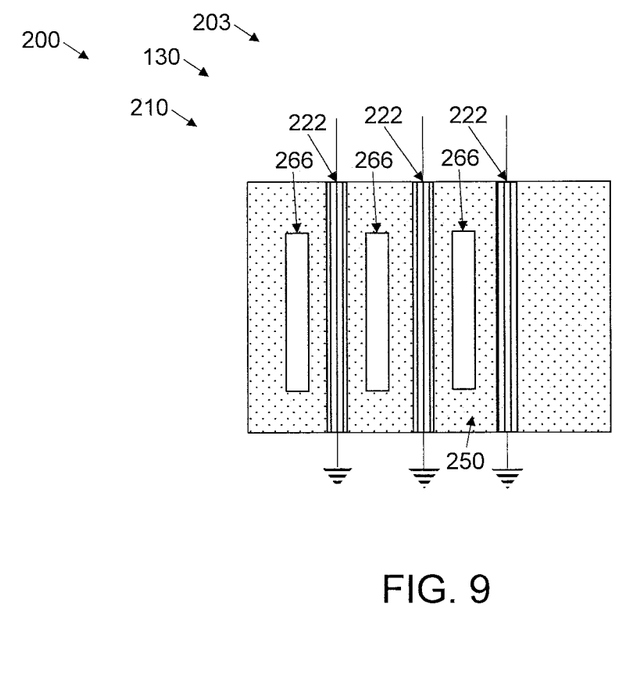

FIGS. 8 and 9 show side and top-down views, respectively, of the structure 210 at a third stage 203 of the process flow 200, in accordance with an embodiment of the present invention.

Referring to FIGS. 1, 8, and 9, at the third stage 203, at step 130, strip the block layer 271. The block layer 271 can be stripped using one or more etching processes or other processes.

Figure 10:
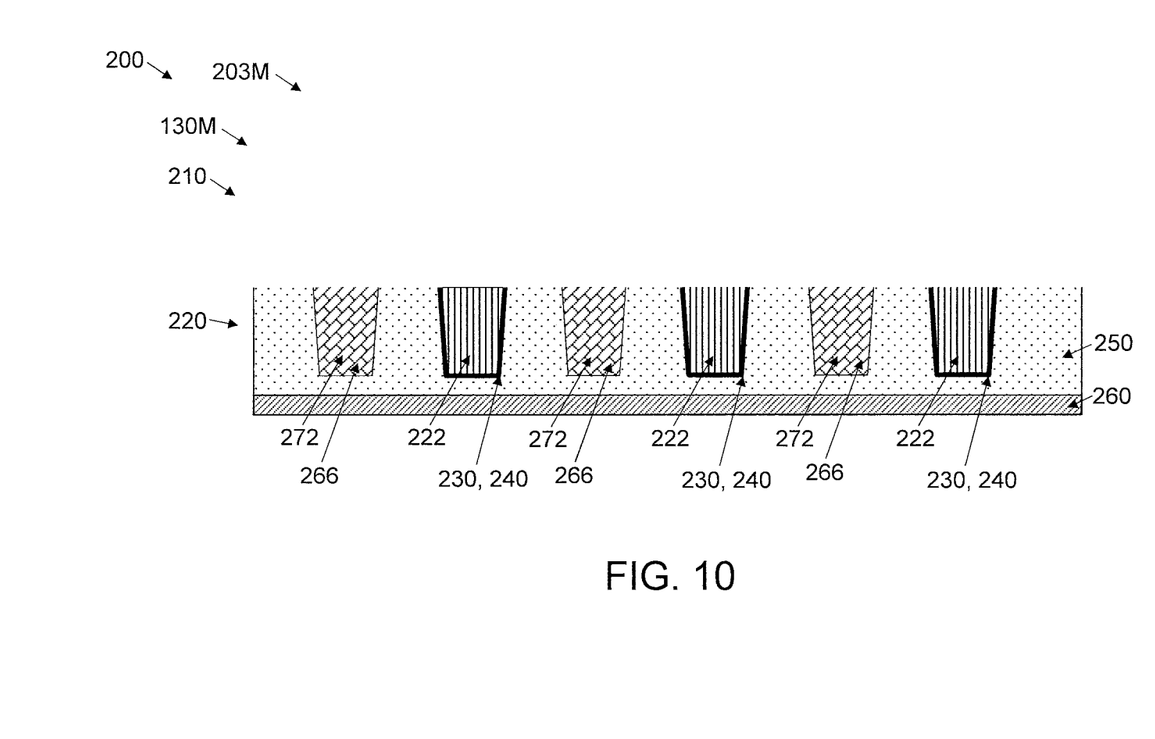
FIGS. 10 and 11 show side and top-down views, respectively, of the sea of lines BEOL structure at a modified third stage of the process flow, in accordance with another embodiment of the present invention.
Figure 11:
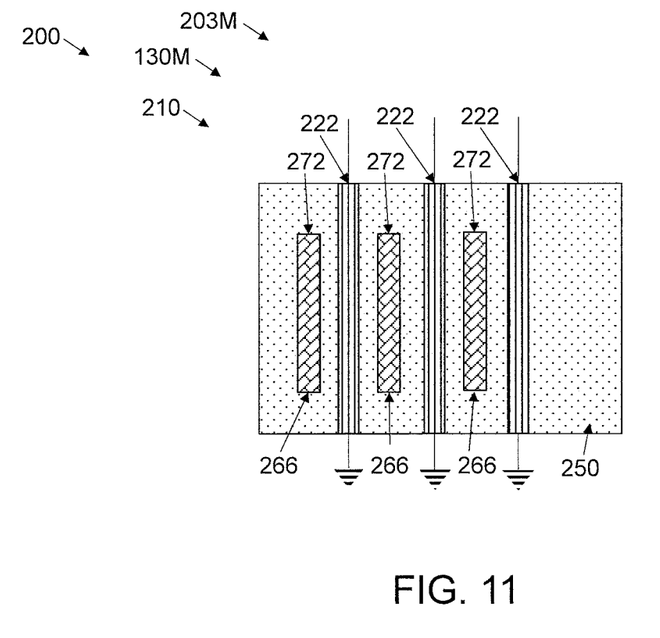

FIGS. 10 and 11 show side and top-down views, respectively, of the structure 210 at a modified third stage 203M of the process flow 200, in accordance with another embodiment of the present invention (relative to FIGS. 8 and 9). The modified third stage 203M can be selectively performed subsequent to the (unmodified) third stage 203, and adds an extra step (step 130M).

Referring to FIGS. 1, 10, and 11, at the modified third stage 203M, at step 130M, fill in the trenches 266 with flow-able or spin-on (low-K) dielectric 272. This can result in less capacitance reduction (than in the case of the (unmodified third stage 203)), but with fewer restrictions imparted from airgap exclusion rules. The dielectric 272 can be applied using any material deposition technique, as readily appreciated by one of ordinary skill in the art.

Figure 12:
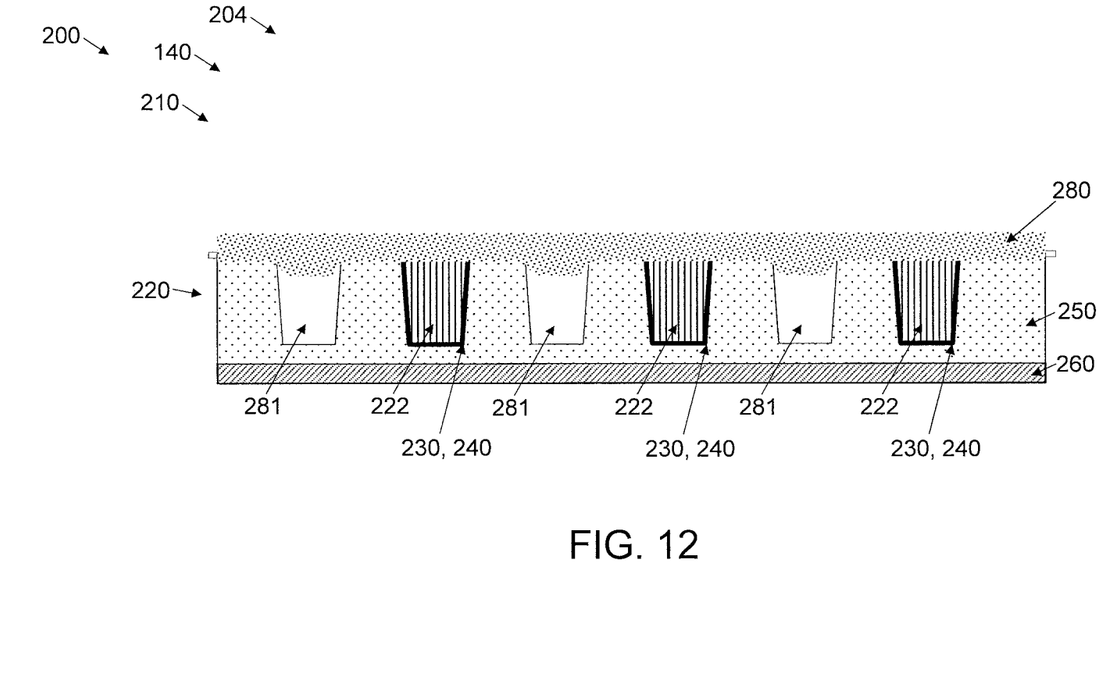
FIGS. 12 and 13 show side and top-down views, respectively, of the sea of lines BEOL structure at a fourth stage of the process flow subsequent to the third stage, in accordance with an embodiment of the present invention.
Figure 13:
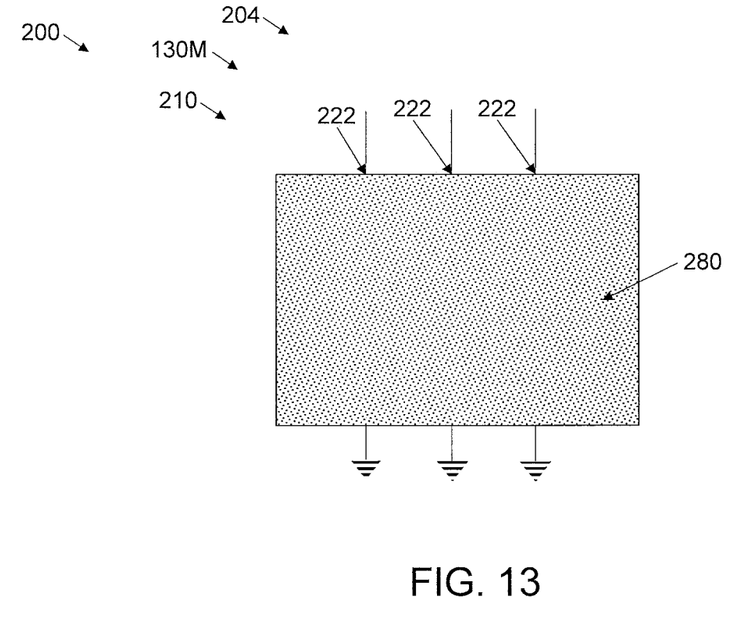

FIGS. 12 and 13 show side and top-down views, respectively, of the structure 210 at a fourth stage 204 of the process flow 200 subsequent to the third stage 203, in accordance with an embodiment of the present invention.

Referring to FIGS. 1, 12, and 13, at the fourth stage 204, at step 140, apply a non-conformal dielectric cap 280 to seal-in the resultant airgaps 281. The dielectric cap 280 can be applied using any material deposition technique, as readily appreciated by one of ordinary skill in the art.

Figure 14:
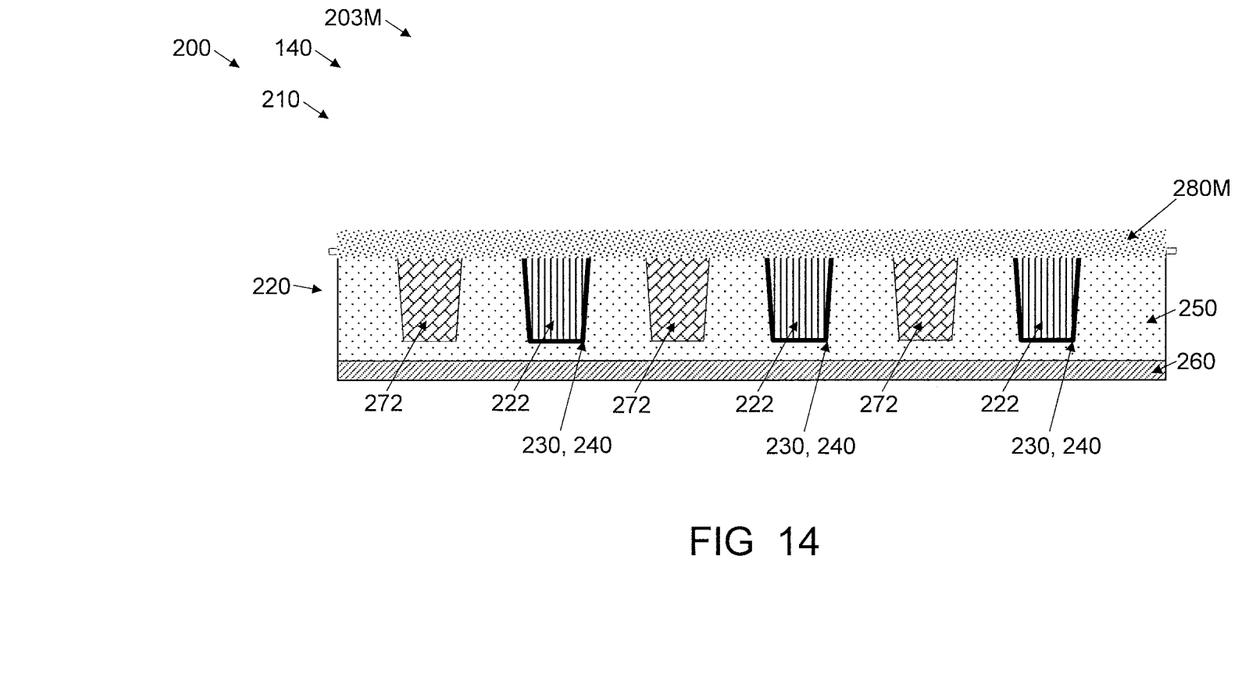
FIG. 14 shows a side view of the sea of lines BEOL structure at a modified fourth stage of the process flow subsequent to the modified third stage, in accordance with an embodiment of the present invention.

FIG. 14 show a side view of the structure 210 at a modified fourth stage 204M of the process flow 200 subsequent to the modified third stage 203M, in accordance with an embodiment of the present invention. It is to be noted that the top-down view of the structure 210 at the modified fourth stage 204M will look the same as FIG. 13, as the dielectric cap 280 is the top-most visible portion of the structure 210.

Referring to FIGS. 1 and 14, at the modified fourth stage 204M, at step 140M, apply a non-conformal dielectric cap 280M to seal-in the dielectric 272. The dielectric cap 280M can be applied using any material deposition technique, as readily appreciated by one of ordinary skill in the art.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor interconnect structure, comprising:
a plurality of metal lines disposed within a dielectric layer including a dielectric material;
a plurality of airgaps defined within openings of the dielectric layer; and
a single dielectric cap including one material disposed over both the plurality of metal lines and over the plurality of airgaps,
wherein the single dielectric cap partially extends into upper areas of the plurality of airgaps and concurrently directly contacts an upper surface of the plurality of metal lines; and
wherein the plurality of metal lines and the plurality of airgaps are disposed in an alternating manner with respect to each other and are vertically misaligned with respect to each other by equal volumetric regions of the dielectric material, the volumetric regions of the dielectric layer being equal to volumetric regions of both the plurality of metal lines and the plurality of airgaps.

2. The semiconductor interconnect structure of claim 1, wherein the plurality of airgaps provide for a reduction in parasitic capacitance.

3. The semiconductor interconnect structure of claim 1, wherein the plurality of metal lines include copper (Cu).

4. The semiconductor interconnect structure of claim 1, wherein the single dielectric cap is a non-conformal dielectric cap.

5. The semiconductor interconnect structure of claim 1, wherein each airgap of the plurality of airgaps occupies a space approximately equal to a space occupied by each metal line of the plurality of metal lines.

6. The semiconductor interconnect structure of claim 1, wherein a dielectric liner is disposed between the plurality of metal lines and the dielectric layer.

7. The semiconductor interconnect structure of claim 6, wherein the dielectric liner includes ruthenium (Ru).

8. The semiconductor interconnect structure of claim 1, wherein the semiconductor interconnect structure is disposed in a Back End Of Line portion of a semiconductor device having one or more active components.

9. The semiconductor interconnect structure of claim 1, wherein the plurality of airgaps have a substantially equal size.

10. The semiconductor interconnect structure of claim 1, wherein the dielectric cap seals the plurality of airgaps.

* * * * *